United States Patent
Yamamoto (10) Patent No.: US 7,068,694 B2
(45) Date of Patent: Jun. 27, 2006

(54) MOLD TYPE SEMICONDUCTOR LASER

(75) Inventor: Takeshi Yamamoto, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 218 days.

(21) Appl. No.: 10/856,763

(22) Filed: Jun. 1, 2004

(65) Prior Publication Data

US 2004/0240502 A1  Dec. 2, 2004

(30) Foreign Application Priority Data

Jun. 2, 2003  (JP) .............................. 2003-156318

(51) Int. Cl.
H01S 5/00 (2006.01)
H01S 3/04 (2006.01)

(52) U.S. Cl. .................................... 372/43.01; 372/36

(58) Field of Classification Search .................. 372/36, 372/43; 257/98–99
See application file for complete search history.

(56) References Cited

U.S. PATENT DOCUMENTS 5,068,866 A * 11/1991 Wada et al. .................... 372/36
5,614,735 A *  3/1997 Kitamura et al. ............. 257/99
5,825,054 A * 10/1998 Lee et al. ...................... 257/98
6,069,905 A *  5/2000 Davis et al. ............. 372/50.124
6,567,435 B1 *  5/2003 Scott et al. ............. 372/29.021
6,784,511 B1 *  8/2004 Kunihara et al. ............ 257/433

FOREIGN PATENT DOCUMENTS

JP  58-143443      8/1983
JP  63253676 A  * 10/1988
JP  2001-284695   10/2001

* cited by examiner

Primary Examiner—Minsun Oh Harvey
Assistant Examiner—Phillip Nguyen
(74) Attorney, Agent, or Firm—Rabin & Berdo, PC (57) ABSTRACT

A laser chip is mounted on a die pad with respective leads being secured thereto through a package. The package includes a body portion which has at least an upper mold resin portion that covers the upper face side (B) with respect to a lower face of the die pad serving as a parting line (A); and two frame side walls, which extend in a direction parallel to the laser-beam outgoing direction (C) of the laser chip, and also extend ahead of the laser chip outgoing face (D) on both sides with the laser chip interposed therebetween. Slits are formed in each of the two frame side walls not in a direction perpendicular to the outgoing direction of the laser beam, but with a predetermined angle for correcting astigmatism, and transparent plate 7 is secured to the slits. Consequently, it is possible to provide a semiconductor laser for use in an optical disk, which has an inexpensive structure using not a can-type structure, but a lead frame and mold resin, and is capable of positively correcting astigmatism.

11 Claims, 5 Drawing Sheets

MOLD TYPE SEMICONDUCTOR LASER

FIELD OF THE INVENTION

The present invention relates to a semiconductor laser having a small-size structure that is easily manufactured at low costs, which is in particular suitably applied to a pickup-use light source for use in CDs, DVDs (digital versatile disks), DVD-ROMs, data-writable CD-R/RWs and the like. More specifically, the present invention concerns a mold type semiconductor laser having a structure that is not a conventional can-type structure covered with a metal cap, but a package structure made of resin so as to achieve low costs, and is capable of correcting astigmatism.

BACKGROUND OF THE INVENTION

Figure 6:
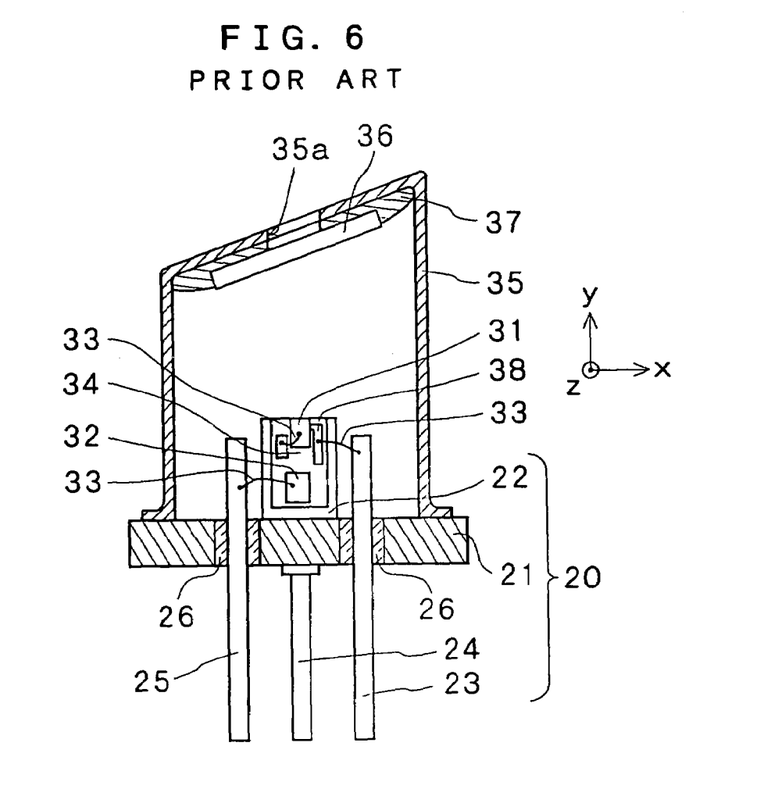
FIG. 6 is an explanatory drawing that shows a semiconductor laser as an example in which astigmatism is corrected by using a conventional can-type structure.

A conventional semiconductor laser of a stem type, which is applied to a CD-use pick-up or the like and capable of preventing astigmatism, has a structure shown in FIG. 6. In this example, a metal material such as iron is formed by a cold forging method so that one portion in the center of a base 21 is raised to form a heat sink portion 22, and leads 23 and 25 are secured thereto using glass 26 or the like to form a stem 20, and in this stem 20, a laser chip 31 is mounted on the heat sink unit 22 through a sub-mount 34 made of a silicon substrate or the like, and one of electrodes (on the rear side of the chip 31) is electrically connected to the lead 23 by a wire 33 through a relay portion 38 of the sub-mount 34, with the other electrode being connected to the sub-mount 34 through a wire 33; thus, the other electrode is electrically connected to a common lead 24 via the heat sink portion 22 and the base 21 through the rear face of the sub-mount 34.

Here, reference numeral 32 represents a monitor-use light-receiving element in which one of electrodes is electrically connected to the lead 25 through the wire 33, with the other electrode being electrically connected to the common lead 24 through the sub-mount 34, the heat sink unit 22 and the base 21. Further, a cap 35 is put on the periphery thereof, and a through hole 35a is formed in the center of the top of the cap 35 so as to allow light emitted by the laser chip 31 to penetrate, and a glass plate 36 is sealded thereto by using a bonding agent (low melting-point glass) 37 so as to seal the through hole 35a. As shown in FIG. 6, the top of the cap 35 is cut diagonally, and the glass plate 36 having a predetermined thickness is placed so as to tilt with not 90°, but a predetermined angle to the direction of the laser beam in the lamination in-plane (x-y plane) of the semiconductor layer of the laser chip 31 so that an astigmatic difference with the opposite sign, which has the same amount as the astigmatic difference generated in the laser chip 31, is generated to correct the astigmatism; and this method has been proposed (for example, by Japanese Examined Patent Publication No. Hei 5-6261 (FIG. 2)).

Figure 7:
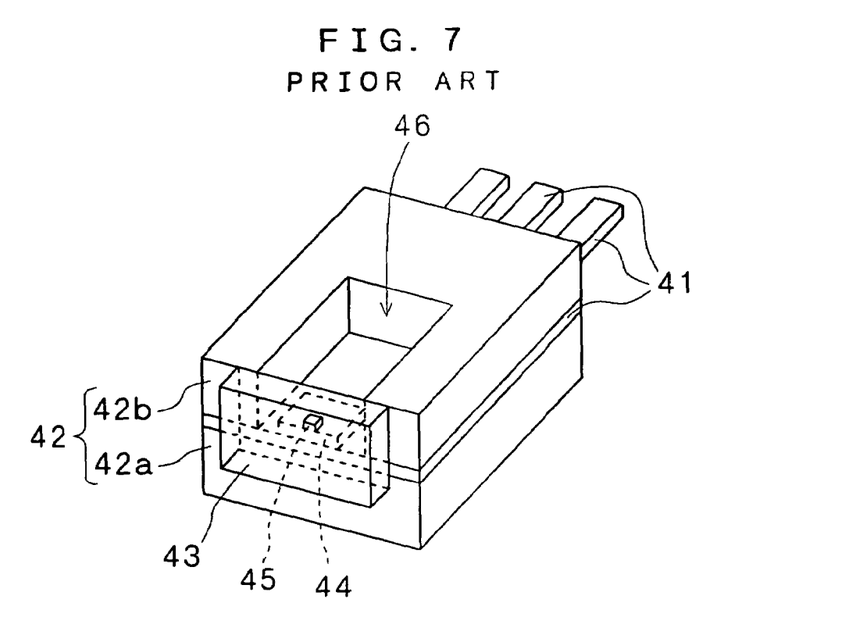
FIG. 7 is an explanatory drawing that shows a semiconductor laser that is formed by a conventional resin mold.

As shown in FIG. 7, for example, Japanese Laid-Open Patent Publication No. 2001-284695 has proposed a structure of a semiconductor laser to be used in an optical disk system such as CDs, in which a package 42 is formed by a lower mold 42a and an upper mold 42b by using a lead frame 41 with an optical isolator 43 being installed on its light-outgoing face. In FIG. 7, reference numeral 44 represents a sub-mount, 45 represents a laser chip and 46 represents an opening section of a resin mold.

As described above, with respect to the conventional semiconductor laser for use in a pickup of a CD, DVD or the like, a package having the can-type structure has been mainly used, and in order to correct the astigmatism on the semiconductor laser side, the package needs to be molded into a special shape with the cap being diagonally cut. In order to correct astigmatism, such a can-type structure requires an expensive cold-forging stem and also needs to form a special shape with the cylinder-shaped cap being diagonally cut, and this structure raises a problem of high costs. In particular, in order to correct the astigmatism, the angle to the outgoing direction of a laser beam and the thickness of a transparent plate needs to be strictly determined in accordance with the astigmatic difference of the laser beam that is emitted by the laser chip; therefore, not only the forming process of the cap, but also factors such as rotation at the time of welding the cap need to be strictly controlled, and these also cause high costs. Moreover, because of increase of a number of parts required, the can-type structure needs to prepare a number of processes and a difficult engineering technique, resulting in degradation in the yield.

In the case of a so-called frame-laser structure using a lead frame, as shown in FIG. 7, a structure in which an optical isolator is bonded to the end face of a mold resin has been proposed. However, in the case of a structure in which a transparent plate or a circular polarizing plate (optical isolator) is simply placed, even when the end face of resin is not a flat face and is slightly tilted, the resulting adverse effects are small; in contrast, in the case of a structure that requires a strict layout of a transparent plate in which, in order to correct the astigmatism, the transparent plate having a predetermined thickness needs to be placed at right angles to the semiconductor lamination plane of the laser chip with a tilt at a predetermined angle from 90° with respect to the axis direction of the laser beam, in a molded resin formed by an upper mold and a molded resin formed by a lower mold, the end faces of the molded resins are not made coincident with each other, resulting in a step difference between the upper mold and the lower mold on a parting line and the subsequent tilt in a circular polarizing plate or the like to be bonded to the end faces; therefore, this structure that the transparent plate is bonded in a manner so as to bridge the upper mold resin and the lower mold resin, rises a problem that fails to provide desired properties.

SUMMARY OF THE INVENTION

The present invention has been devised to solve the above-mentioned problems, and its objective is to provide a semiconductor laser for use in an optical disk such as a CD and a DVD, which has an inexpensive structure using not a can-type structure, but a lead frame and mold resin, and is capable of positively correcting astigmatism on the semiconductor laser side.

A mold type semiconductor laser in accordance with the present invention includes: a die pad formed by a plate-shaped lead frame and a plurality of leads, the die pad being connected to one of the leads; a package that is made of mold resin, and integrally holds the die pad and the leads; a laser chip that is mounted on the die pad through a sub-mount; and a transparent plate that is placed in front of the light-outgoing face of the laser chip; and in this arrangement, the package is provided with at least an upper mold resin portion which, in the case when the lower face of the die pad and the leads serves as a parting line, covers the leads on the upper face side from the parting line; the upper mold resin is provided with two frame side walls, which extend in a direction parallel to the laser-beam outgoing direction of the laser chip, and also extend ahead of the laser chip outgoing face on the two sides with the laser chip interposed therebetween; and each of the two frame side walls is provided with a slit, which is used for placing the transparent plate on the two frame side walls not in a direction perpendicular to the outgoing direction of the laser beam but with a predetermined angle for correcting astigmatism, and which is formed with a depth deeper than the lower face of the laser chip (face on the sub-mount side of the laser chip), from the upper face side of the frame side walls, and wherein the above-mentioned transparent plate is secured into two slits of the two frame side walls, and only in the upper mold resin portion.

Here, the upper face and the lower face are defined so that the face on the side to which the laser chip of the die pad is bonded refers to the upper face and the side opposite thereto refers to the lower face, and the forward direction refers to a direction in which a laser beam to be used is radiated from the laser chip, and allowed to proceed. Moreover, the transparent plate refers to a plate that is not necessarily transparent completely, as long as it is capable of transmitting light to a degree not causing any problems, and may include materials that are semi-transparent.

With this arrangement, a slit is formed in each of the two frame side walls of the mold resin, and the transparent plate is inserted to the slits and secured therein; thus, since the slits are formed so as to make a predetermined angle between the transparent plate and the outgoing direction of the laser beam, the installation of the transparent plate is very easily carried out, and the angle of the slits (the angle between a direction connected two slits of two frame side walls and the outgoing direction of the laser beam) is accurately determined by the corresponding a die so that the transparent plate, inserted into the slits, is accurately set with a desired angle with respect to the outgoing direction of the laser beam.

Moreover, the slits are formed in only the upper mold resin portion so as not to bridge the parting line of the molds, with no effect of a step difference due to an offset between the upper and lower dies. Consequently, it is only necessary to insert the transparent plate in the slits to be secured therein so that the transparent plate is placed at a very accurate angle; thus, it is possible to provide a semiconductor laser with high performances in which the astigmatism has been corrected, while using a very inexpensive frame laser.

Figure 1A:
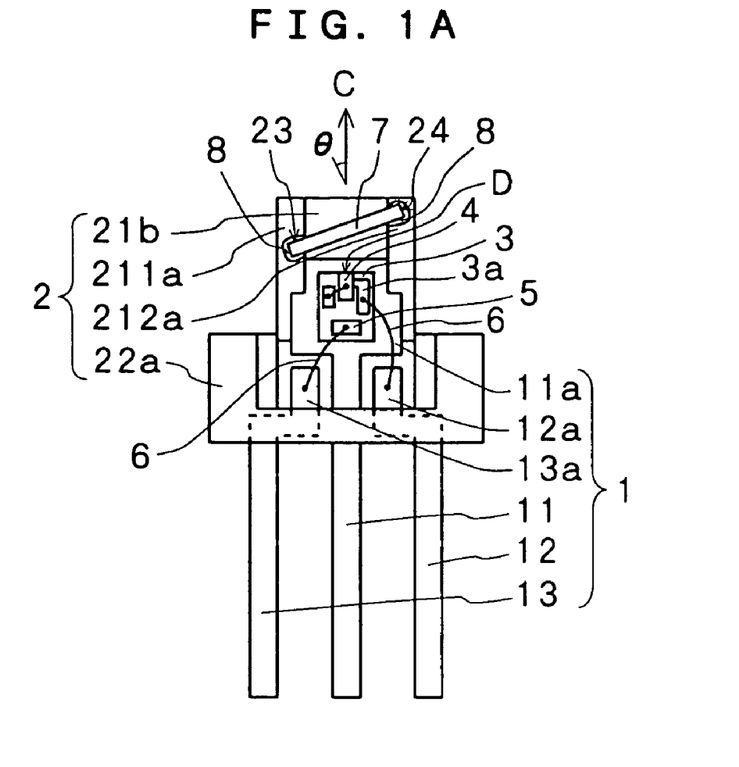
FIGS. 1A and 1B are front and plan views that explain a structure of one embodiment of a mold type semiconductor laser in accordance with the present invention.
Figure 1B:
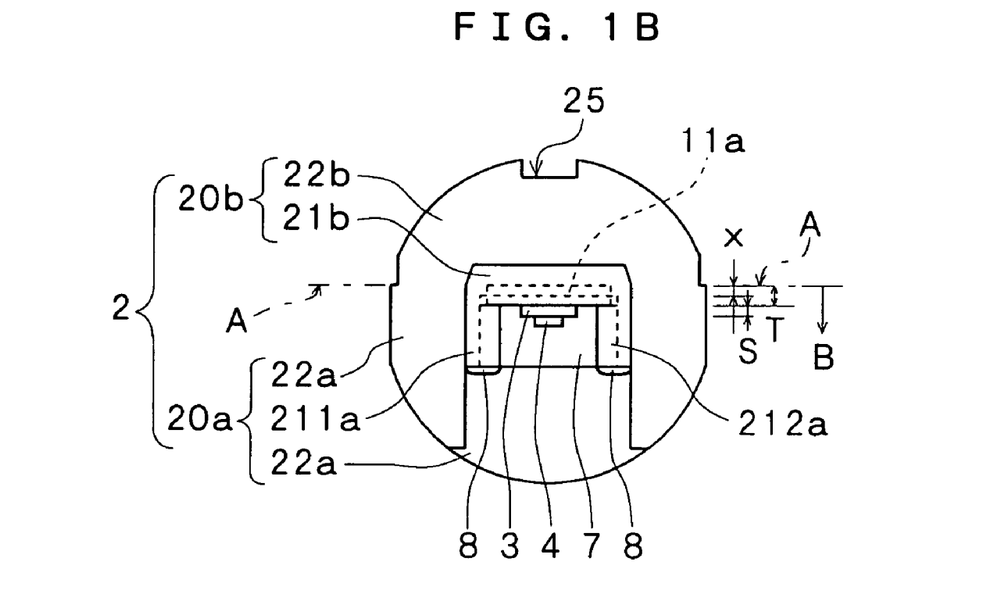

The above-mentioned package may be formed with the upper mold resin portion and the lower mold resin portion defined by a parting line, and may have a structure in which a body portion, which has a substantially circular shape in its outer shape, and the two frame side walls, which are provided on the center side of the body portion, and extend in the laser beam outgoing direction. Here, for example, as shown in FIG. 1B, the substantially circular shape includes nearly circular shapes, such as those having a partial cutout section and concave section.

Another structure may be proposed in which the above-mentioned package is made of only the upper mold resin portion with the slits being formed in a manner so as not to penetrate the upper mold resin portion. In this structure, since the rear face side of the die pad is exposed without being covered with the resin, a cooling plate is made in contact therewith; thus, even in the case of a high-power semiconductor laser, it is possible to provide a superior heat radiating property and consequently to maintain superior element characteristics, and since the slits are formed deeper than the lower face of the laser chip in a manner so as not to penetrate the upper mold resin portion, the transparent plate can be inserted and easily secured thereto by using only a bonding agent, while the astigmatism is corrected without interrupting the laser beam.

By removing a portion of each of the frame side walls located on the front side from the slit, it is possible to provide a structure in which the transparent plate is secured to a step difference formed by one wall face and a bottom face of the slit which is formed on the tip of each of the frame side walls. Even in the structure of this type, since the step difference itself is accurately positioned by the die in the same manner as the slit, the transparent plate is merely made in contact with the step difference and secured thereto without the necessity of the insertion; thus, although more bonding portion to be secured is required, the transparent plate is made in contact with the front face, while being mounted on the step difference, and then subjected to a coating process of a bonding agent, so that it is possible to secure the transparent plate more easily with a shortened length of the semiconductor laser, and consequently to achieve a small size.

DETAILED DESCRIPTION

Next, referring to drawings, the following description will discuss a mold type semiconductor laser in accordance with the present invention. As shown in FIGS. 1A and 1B that explain the front face and the upper face of one embodiment thereof, the mold type semiconductor laser of the present invention is provided with a die pad 11a formed by a plate-shaped lead frame 1 and a plurality of leads 11 to 13 that are integrally held by a package 2 made of a mold resin. A laser chip 4 is mounted on the die pad 11a through a sub-mount 3. Further, on the front side of the light-outgoing face D of the laser chip 4, not in a direction perpendicular to the outgoing direction C of the laser beam, but with a predetermined angle θ to be used for correcting astigmatism, transparent plate 7 is secured into slits 23 and 24 that are formed in the package 2.

Here, θ represents an angle formed by the transparent plate 7 with respect to a plane perpendicular to the outgoing direction C of the laser beam, that is, an angle made by the normal direction of the transparent plate 7 and the outgoing direction C of the laser beam. Further, a main surface of the transparent plate 7 is substantially parallel to a reverse surface thereof.

The package 2 is provided with at least an upper mold resin portion 20a which, in the case when the lower face of the die pad 11 and the leads 11 to 13 serves as a parting line A, covers the leads 11 to 13 on the upper face side B from the parting line A; the upper mold resin portion 20a is provided with at least two frame side walls 211a and 212a that extend in a direction parallel to the laser-beam outgoing direction C of the laser chip 4, and also extend ahead of the outgoing face D of the laser chip 4 on the two sides with the laser chip 4 interposed therebetween; and the above-mentioned slits 23 and 24 are formed only in the upper mold resin portion 20a, with a depth deeper than the lower face of the laser chip 4, more preferably, deeper than the upper face of the die pad 11a, from the upper face side of the frame side wall, in the two frame side walls 211a and 212a so that the above-mentioned transparent plate 7 are secured into the slits 23 and 24.

Figure 2:
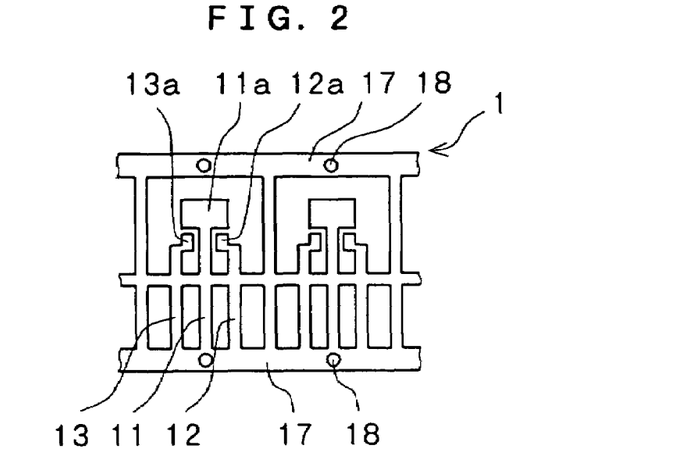
FIG. 2 is a drawing that explains a lead frame to be used in the semiconductor laser of FIG. 1.

As shown in FIG. 2, the lead frame 1 is formed by carrying a punching process on a plate member having a thickness of about 0.4 mm, made of, for example, 42 alloy or copper, and the first to third leads 11 to 13 are secured to a side rail 17, while a die pad 11a is formed on the tip of the first lead 11 and wire bonding portions 12a and 13a are respectively formed on the tips of the second and third leads 12 and 13, and a plurality of sets composed these leads are connected. As shown in FIG. 1, the laser chip 4, etc. are assembled on this lead frame 1 to form a package 2, and the respective leads 11 to 13 are then cut from the side rail 17 to be separated to form respective semiconductor lasers. Here, reference numeral 18 represents an index hole.

Figure 5:
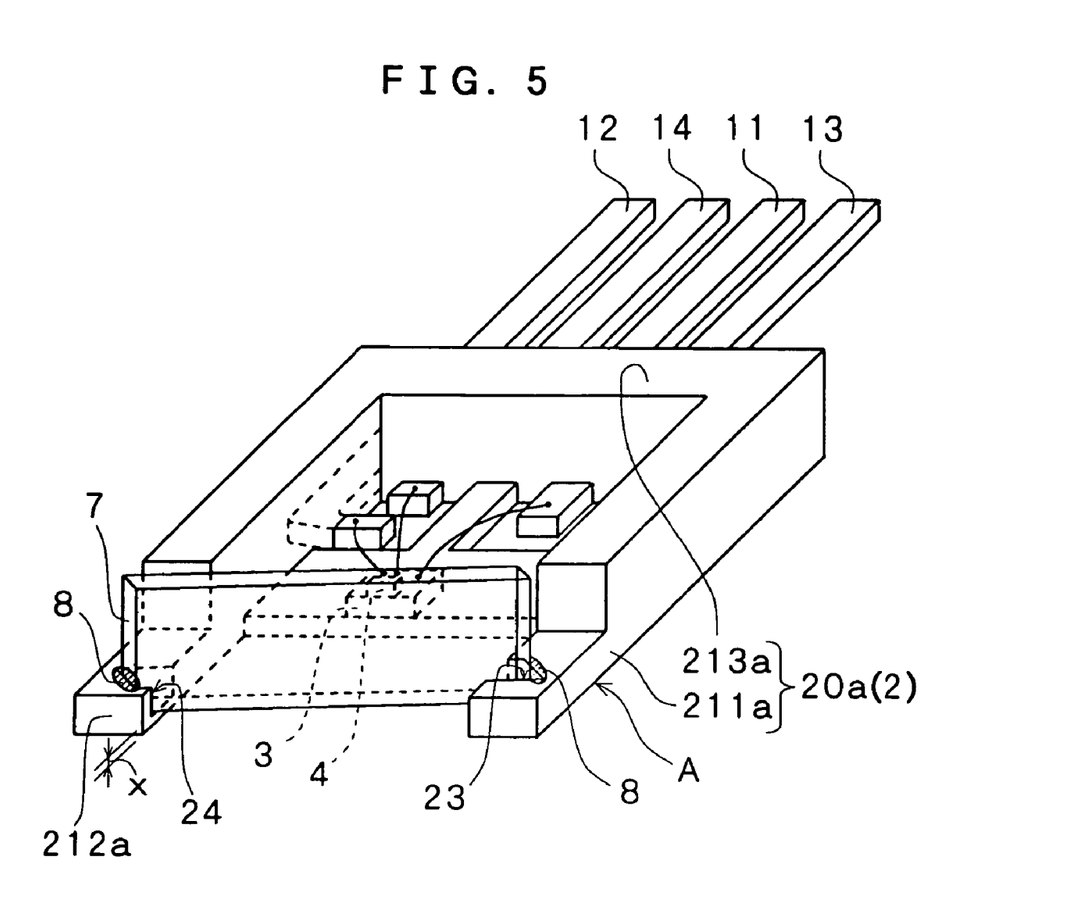
FIGS. 5 is an explanatory drawing that shows still another embodiment of the semiconductor laser in accordance with the present invention.

In this example, the laser chip 4 is used for a single wavelength, and three leads are formed including a lead for use in a monitor-use light-receiving element 5; however, in the case when, for example, as shown in FIG. 5 that will be described later, a two-wavelength-use laser chip is used as the laser chip 4, four leads may be used to form a package 2 having a shape as shown in FIG. 1. The number of leads to be formed in the lead frame 1 can be freely set in accordance with the laser chip 4 and the light-receiving element 5.

The laser chip 4 is formed to have a normal double-hetero structure made of a compound semiconductor of, for example, AlGaAs-based, InGaAlP-based or GaN-based, and the size is set to about 250 μm×250 μm for CDs, about 250 μm×500 μm for DVDs and 250 μm×800 μm for CD-R/RWs. These are extremely small so that for convenience of handling, these are normally bonded onto a silicon substrate or a sub-mount 3 made of AlN (aluminum nitride) or the like, having a size of about 0.8 mm×1 mm. Moreover, as shown in FIG. 1A, one of electrodes is connected to the sub-mount 3 through wire bonding using gold wire 6 or the like, and is further connected to the first lead 11 through the die pad 11a by a conductive bonding agent or the like through the rear face thereof, while the other electrode (rear face electrode) is connected to the second lead 12 through wire bonding using gold wire 6 or the like via the connecting portion 3a on the sub-mount 3.

Moreover, a light-receiving element 5 that monitors the light emission output of the laser tip 4 is installed on the sub-mount 3 in the same manner, with one of its electrodes being connected to the first lead 11 through the sub-mount 3 and die pad 11a and the other electrode being directly electrically connected to the third lead 13 by wire bonding through gold line 6 or the like. Here, the light-receiving element 5 may be placed separately from the sub-mount 3, or no light-receiving element 5 is used, when the light-receiving element 5 is not necessary.

The package 2, which is used for firmly securing the first to third leads 11 to 13 without being individually scattered, even when separated from the lead frame, and for positively maintaining connections between the respective electrodes of the laser chip 4 and the leads 11 to 13, is formed as a resin molded product by transfer mold or the like. In the example shown in FIG. 1, in order to provide a structure similar to the conventional can package, the package 2, made of molded resin, is provided with a stem portion and body portions 22 (22a, 22b) that corresponds to the cap portion, and are placed on the periphery thereof, and a frame 21 that protects the side faces of the laser chip 4. In the present invention, upon forming this molded resin, a division face (parting line) A of the die is set to the lower face of the lead frame 1 so that an upper mold resin portion 20a and a lower mold resin portion 20b are formed so as to cover both of the upper face side and the lower face side; thus, the upper mold resin portion 20a includes frame side walls 211a and 212a and the upper body portion 22a while the lower mold resin portion 20b includes a frame bottom face 21b and a lower body portion 22b.

Here, each of the body portions 22, which is formed into a virtually (substantially) circular shape that corresponds to the conventional stem, is constituted by a portion for securing the leads and a skirt portion that is placed on the laser chip 4 side, and has an opening on the upper face side of the laser chip 4, with a virtually circular shape in the outer shape other than the opening section, and in the same manner as the conventional can-type semiconductor laser, a cut-out section 25 to be used for positioning is formed on the lower face side of the body portion 22.

The two frame side walls 211a and 212a extend in a direction parallel to the laser beam outgoing direction C of the laser chip 4 in a manner so as to extend ahead of the laser chip outgoing face D on both of the sides with the laser chip 4 interposed therebetween, and slits 23 and 24 are respectively formed in the frame side walls 211a and 212a. These slits 23 and 24 to which transparent plate 7, which will be described later, is inserted are formed in such a manner that the slits 23 and 24, formed in the two frame side walls, are allowed to continue through a straight line, and each of the slits 23 and 24 is formed in only the upper mold resin portion 20a, with a depth deeper than the lower face of the laser chip 4, more preferably, deeper than the upper face of the die pad 11a, from the upper face side of the frame side walls 211a and 212a.

As shown in FIG. 1A, the slits 23 and 24 are respectively formed in the frame side walls 211a and 212a so that the direction in which the two slits 23 and 24 are connected is set not at right angles to the outgoing direction C of the laser beam, but at an angle θ to the face forming right angles, that is, an angle θ that is made by the normal direction to the face connecting the slits 23 and 24 and the outgoing direction C, which corresponds to a predetermined angle that will be described later, and so that, supposing that the distance between the bottom face of the slits 23 and 24 and the parting line A is x, the thickness of the lead frame (die pad 11a) is T and the thickness of the sub-mount 3 is S, the following inequality is satisfied: $0 \leq x \leq T+S$, more preferably, $0 \leq x \leq T$. In other words, the slits 23 and 24 are formed so as to reach the surface of the die pad 11a or a level lower than the surface, and are also formed in only the upper mold resin portion 20a in such a manner that the transparent plate 7 to be inserted to the slits 23 and 24 completely cover the front face of the laser beam to be released from the laser chip 4.

When the slits 23 and 24 are formed up to the lower mold resin portion 20b, protruding portions for the slits need to be formed on both of the upper die and lower die of the die, and these portions are not completely made coincident with each other between the upper die and lower die of the die to cause a step difference in the slit, resulting in a failure in inserting the transparent plate 7 or a problem in that, when an attempt is made to insert with a widened slit width, the angle tends to deviate.

Moreover, the width of each of the slits 23 and 24 is made virtually the same as the thickness of the transparent plate 7 so that the transparent plate 7 is inserted without causing backlash so much. When the backlash is large, the tilt angle θ tends to vary upon inserting the transparent plate 7. Actually, the width is set to a level about 30 to 50 μm greater than the thickness of the transparent plate 7.

The slits 23 and 24 are formed by preliminarily forming protruding portions in a die to be used for the molding process of the mold resin; therefore, the direction, thickness and height of the protruding portions are accurately formed by the die so that the angle, width and depth of the slits 23 and 24 are formed with precision of the die. Consequently, the angle, width and depth of the slits 23 and 24 can be formed with high precision.

The transparent plate 7 is formed by parallel plate member capable of transmitting light or half-transmitting (translucency) light, such as a glass plate or a plastic plate. The transparent plate 7 is inserted into the slits 23 and 24 formed in the above-mentioned frame side walls, and the upper portion thereof is secured to the frame side walls 211a and 212a by using a bonding agent 8 such as an ultraviolet setting resin that is easily solidified.

Figure 3A:
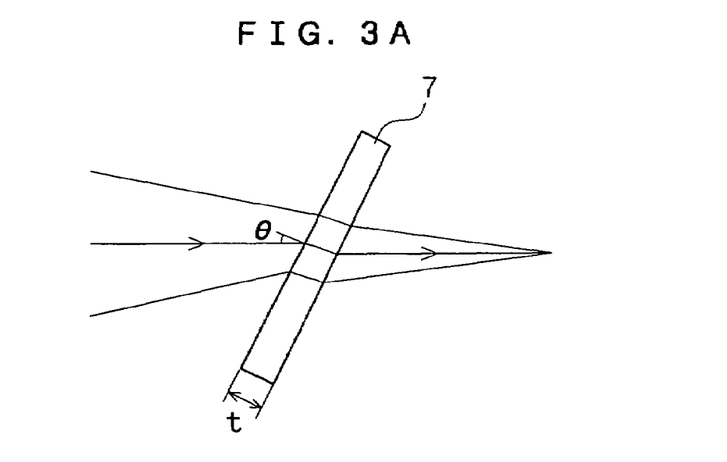
FIGS. 3A and 3B are drawings that explain the principle by which astigmatism can be corrected by transparent plate.
Figure 3B:
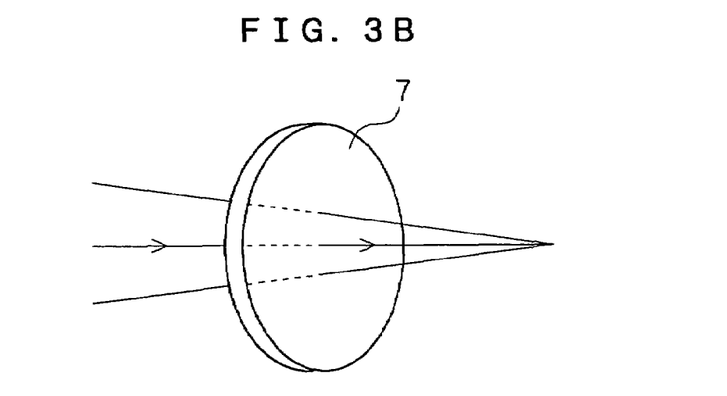

The transparent plate 7 is used for correcting astigmatism generated by the laser chip 4, and as shown in FIG. 3A, in the case when the two ends in the diameter of a light beam having a certain direction are made incident on the transparent plate 7 with different distances due to a tilt of the transparent plate 7, the position of the light-converging point deviates due to refraction by the plate 7, while, as shown in FIG. 3B, on the side in which, in a direction orthogonal to the above-mentioned beam direction, the two ends in the diameter of a light beam are made incident on the transparent plate 7 with the same distance, the position of the light-converging point, as it is, is allowed to converge the light without deviations; thus, it becomes possible to correct astigmatism.

It has been known that, supposing that the angle made by the normal of the transparent plate 7 and the light axis is θ, the thickness is t and the refraction index is n, the amount of correction As of an astigmatic difference in FIG. 3A is represented by the following equation (1); therefore, in the case when the amount of astigmatic difference of the laser chip 4, preliminarily designed, is known, by properly setting the material (refractive index), thickness and tilt angle θ of the transparent plate 7 so as to make the value coincident with the equation (1), it is possible to correct the astigmatism.

$$As = \frac{t}{\sqrt{n^2 - \sin^2\theta}} \left[ \frac{n^2 \cos^2\theta}{n^2 - \sin^2\theta} - 1 \right] \tag{1}$$

In accordance with the semiconductor laser of the present invention, while a laser light source for use as a pickup for an optical disk is formed by a package constituted by a lead frame and mold resin, the laser light source is formed by a semiconductor laser, which has a structure capable of correcting astigmatism. Moreover, slits in which the transparent plate is inserted are formed in only the upper mold resin portion of the package without bridging over to the lower mold resin so that no step difference is formed in the slits, making it possible to place the transparent plate with a very accurate angle. Consequently, by using a very inexpensive structure, that is, a mold-resin-type semiconductor laser, it becomes possible to provide a semiconductor laser with high performances, in which astigmatism is corrected. Here, the astigmatism of the laser chip is made virtually constant through its designing process; therefore, by forming each package by using a die that forms a slit with a predetermined width and a predetermined angle for each of the laser chip, it becomes possible to mass-produce semiconductor lasers having very stable characteristics.

Figure 4A:
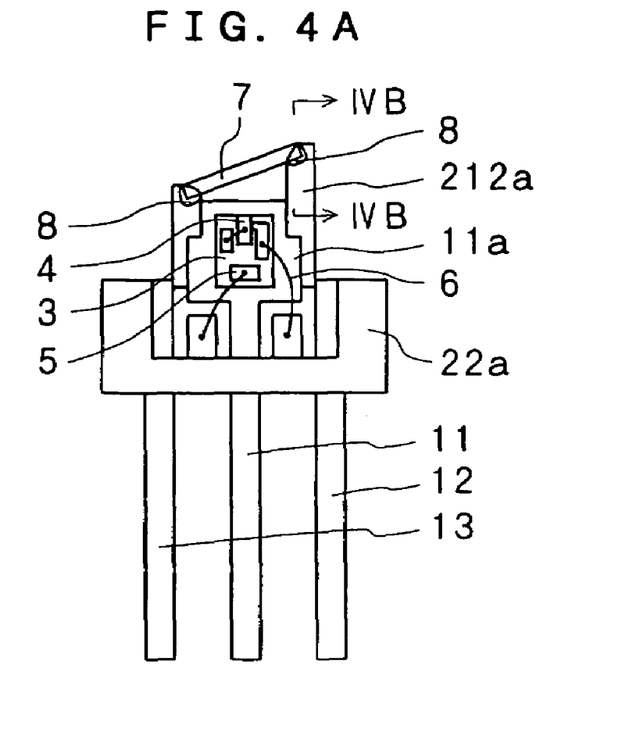
FIGS. 4A and 4B are explanatory drawings that show another embodiment of the semiconductor laser in accordance with the present invention.
Figure 4B:
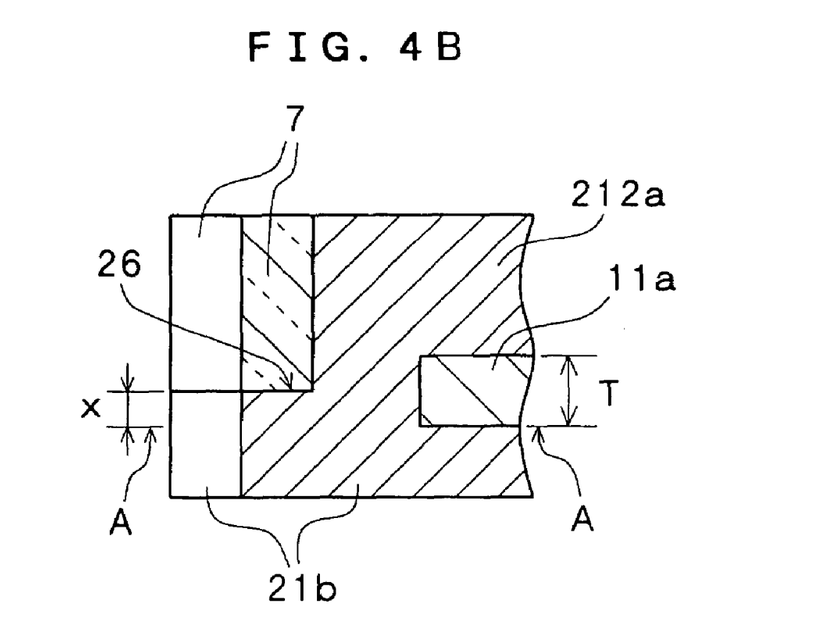

In the above-mentioned examples, the slits 23 and 24 are formed on the inner side closer to the body portion 22 than the tips of the frame side walls 211a and 212a, and this structure of the slits makes the assembling processes easier since the transparent plate 7 are simply inserted with the upper portions thereof being secured. However, in the case of a semiconductor laser in which a small size in terms of the length or the like is required, portions of the frame side walls 211a and 212a that are located ahead of the slits 23 and 24 may be removed as shown in FIG. 4A. In this case, as shown in FIG. 4B that is an explanatory drawing of a cross-sectional view taken along line IVB—IVB of the slit portion of the frame side wall 212a, the structure may simply has a shape in which only a step difference 26 is formed on the tip of the frame side walls 211a and 212a.

This step difference 26, of course, simply has a shape in which the tip of the slit is removed, and the bottom face thereof has a depth deeper than the lower face of the laser chip 4, more preferably, deeper than the upper face of the die pad 11a, with the distance from the lower face of the die pad being set to x without being formed into the lower portion mold resin 21b, and the wall face (tip face of frame side wall) is formed with the above-mentioned predetermined angle θ. In FIG. 4B, the slope face and the cross section of the transparent plate 7 (frame bottom face 21b) is shown in a non-cross-sectional view and a cross-sectional view in an exaggerated manner.

In this structure, it is not possible to insert the transparent plate 7 in a manner so as to secure the upper portion by using a bonding agent, and the transparent plate 7 needs to be made in press-contact with the end face so that the peripheral portion is secured thereto by using a bonding agent 8; however, the desired angle is accurately formed by the frame side walls 121a and 122a when these are merely pressed thereto so that, in the same manner as the above-mentioned examples, the transparent plate 7 can be attached with an accurate angle, and a small-size structure having a shorter length can also be achieved.

FIGS. 5 is an explanatory perspective view that shows still another embodiment of the semiconductor laser in accordance with the present invention. In this example, the package 2 is formed on only one of the surfaces of the lead frame, and the laser chip 4 has a two-wavelength pulsation-type structure. For this reason, four leads are formed, and the rear faces of the die pad 11a and the respective leads 11 to 14 (rear face side of the drawing) are exposed externally. In other words, no lower mold resin portion is present, and only the upper mold resin portion 20a is formed so that the lower face of the package 2 is allowed to form a parting line A. In this example, the upper mold resin portion 20a is also formed into a flat package without a body portion, and formed by only the frame side walls 211a and 212a and a frame securing portion 213a, with the frame side walls 211a and 212a protruding forward from both of the sides of the laser chip 4 ahead of the die pad 11a. Here, in the example shown in FIG. 5, the thickness on the tip side of the frame side walls 211a and 212a is made thinner; however, the thickness may be set to the same as that of the frame securing portion 213a.

In this example, with respect to the depth of the slits 23 and 24, since no lower mold resin is placed, the slits 23 and 24 are formed so as not to reach the lower face of the upper mold resin portion 20a with a resin portion having a thickness of x remaining between the bottom of the slits 23 and 24 and the lower face. Since the slits 23 and 24 need to be made as deep as the lower face of the laser chip 4 or deeper than that as described earlier, this thickness x of the resin portion remaining on the bottom face side is formed so that, supposing that the thickness of the lead frame is T and the thickness of the sub-mount 3 is S, the following inequality is satisfied: $0<x\leq T+S$, more preferably, $0<x\leq T$. The lower limit thereof is set to any value as long as a sufficient mechanical strength for maintaining the transparent plate 7 is prepared. When, although the mechanical strength is not so great, it sufficiently maintains the transparent plate 7, the transparent plate is secured by the bonding agent 8 after having been inserted; therefore, the bonding agent makes it possible to provide a sufficient mechanical strength.

In this example, since the laser chip 4 is prepared for use in the two-wavelength light-emitting device as described earlier, leads, which individually operate the respective light-emitting portions, are formed separately, and a lead 14 to be connected to the second-wavelength light-emitting portion is newly installed, and connected to the laser chip 4 through wire bonding; however, the other structures are the same as those shown in FIG. 1, and in particular, the layouts of the slits 23 and 24 formed in the frame side walls 211a and 212a and the transparent plate 7 are the same as those described in the above-mentioned example. Therefore, the same parts are indicated by the same reference numerals, and the description thereof is omitted. In this example also, by removing the frame side walls 211a and 212a located on the front side from the slits 23 and 24, in place of the slits, the tip may be provided with a step difference, in the same manner.

Moreover, a flat package, as shown in FIG. 5, is formed to prepare a structure including only the upper mold resin portion so that the rear face side of the die pad is exposed to improve the cooling property; and this structure is suitably applied to the two-wavelength pulsation-type structure. Here, as shown by an example in FIG. 1, a single-wave-use structure with three leads may be prepared to form a flat package, or a structure having only the upper mold resin portion with the rear face being exposed may be prepared. Even in the case of a laser chip 4 for use in a single-wave-use structure, the structure with the exposed rear face is desirable from the view point of heat radiation, when the output is great.

In accordance with the present invention, with a structure formed by resin mold, transparent plate is accurately placed on the front side of a laser chip with a predetermined angle so that it becomes possible to accurately correct astigmatism. As a result, in place of a can-type semiconductor laser that requires complex manufacturing processes using a conventional diagonally-cut cap as well as a stem, and is very expensive, a semiconductor laser is prepared as a light source for use in CDs and DVDs at very low costs, that is, ⅓ of the conventional cost, thereby making it possible to greatly cut the manufacturing costs of the optical disk system.

Although preferred examples have been described in some detail it is to be understood that certain changes can be made by those skilled in the art without departing from the spirit and scope of the invention as defined by the appended claims.

What is claimed is:

1. A mold type semiconductor laser comprising:
   a die pad and a plurality of leads formed by a plate-shaped lead frame, the die pad being connected to one of the leads;
   a package that is made of mold resin, and integrally holds the die pad and the leads;
   a laser chip that is mounted on the die pad through a sub-mount; and
   a transparent plate that is placed in front of a light-outgoing face of the laser chip,
   wherein the package comprises at least an upper mold resin portion which, in the case when the lower face of the die pad and the leads serves as a parting line, covers the leads on the upper face side by the parting line; the upper mold resin has two frame side walls, which extend in a direction parallel to the laser-beam outgoing direction of the laser chip, and also extend ahead of the laser chip outgoing face on the two sides with the laser chip interposed therebetween; and each of the two frame side walls has a slit, which is used for placing the transparent plate on the two frame side walls not in a direction perpendicular to the outgoing direction of the laser beam, but with a predetermined angle for correcting astigmatism, and which is formed from the upper face side of the frame side walls through the lower face of the laser chip, and
   wherein the transparent plate is secured into two slits of the two frame side walls, and only in the upper mold resin portion.

2. The mold type semiconductor laser according to claim 1, wherein the package comprises a body portion, which has a substantially circular shape in the outer shape thereof, and which has the upper mold resin portion and a lower mold resin portion defined by the parting line, and the two frame side walls, which are provided on the center side of the body portion, and extend in the laser beam outgoing direction.

3. The mold type semiconductor laser according to claim 2, wherein the body portion comprises a bottom portion for securing leads, and a skirt portion provided on the body portion, which has an opening section on the upper face side of the laser chip, with a substantially circular shape in the outer shape other than the opening section.

4. The mold type semiconductor laser according to claim 1, wherein the slit has a depth that is defined so that, supposing that the distance between the bottom face of the slit and the parting line is x, the thickness of the die pad is T and the thickness of the sub-mount is S, the following inequality is satisfied: $0\leq x\leq T+S$.

5. The mold type semiconductor laser according to claim 4, wherein the slit has a depth that is defined so that the following inequality is satisfied: $0\leq x\leq T$.

6. The mold type semiconductor laser according to claim 1, wherein the width of the slit is designed to a width 30 to 50 µm greater than the thickness of the transparent plate.

7. The mold type semiconductor laser according to claim 1, wherein the laser chip has a two-wavelength pulsation-type structure.

8. The mold type semiconductor laser according to claim 1, wherein the package is a flat package having only the upper mold resin portion, and the slits are formed so as not to penetrate the upper mold resin portion.

9. The mold type semiconductor laser according to claim 8, wherein the slit has a depth that is defined so that, supposing that the distance between the bottom face of the slit and the parting line is x, the thickness of the die pad is T and the thickness of the sub-mount is S, the following inequality is satisfied: $0 < x \leq T+S$.

10. The mold type semiconductor laser according to claim 9, wherein the slit has a depth that is defined so that the following inequality is satisfied: $0 < x \leq T$.

11. The mold type semiconductor laser according to claim 1, wherein by removing a portion of each of the frame sidewalls located on a front side from the slit, the transparent plate is secured to a step difference formed by one wall face and a bottom face of the slit which is formed on the tip of each of the frame side walls.

* * * * *